US011436478B2

(12) United States Patent
Chang et al.

(10) Patent No.: US 11,436,478 B2
(45) Date of Patent: Sep. 6, 2022

(54) CONTROL CIRCUIT FOR MULTIPLY ACCUMULATE CIRCUIT OF NEURAL NETWORK SYSTEM

(71) Applicant: eMemory Technology Inc., Hsin-Chu (TW)

(72) Inventors: Chia-Fu Chang, Zhubei (TW);
Cheng-Heng Chung, Zhubei (TW);
Ching-Yuan Lin, Zhubei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 361 days.

(21) Appl. No.: 16/874,842

(22) Filed: May 15, 2020

(65) Prior Publication Data
US 2020/0372330 A1    Nov. 26, 2020

Related U.S. Application Data

(60) Provisional application No. 62/851,582, filed on May 22, 2019.

(51) Int. Cl.
*G11C 13/04* (2006.01)
*G11C 11/54* (2006.01)
(Continued)

(52) U.S. Cl.
CPC ......... *G06N 3/063* (2013.01); *H01L 27/2463* (2013.01)

(58) Field of Classification Search
CPC ...... G06N 3/063; G06N 3/049; G06N 3/0635; G06N 3/088; G11C 2013/0078;
(Continued)

(56) References Cited

U.S. PATENT DOCUMENTS

2012/0011092 A1*  1/2012  Tang ...................... G06N 3/063
                                                                706/33
2015/0006455 A1*  1/2015  Suri ....................... G06N 3/063
                                                                706/32
(Continued)

FOREIGN PATENT DOCUMENTS

TW          201209734 A       3/2012
TW          201833824 A       9/2018
WO        WO201910036 A1      1/2019

OTHER PUBLICATIONS

Search report issued by EPO on Oct. 26, 2020.
(Continued)

*Primary Examiner* — Hien N Nguyen
(74) *Attorney, Agent, or Firm* — WPAT, PC

(57) ABSTRACT

A control circuit for a neural network system includes a first multiply accumulate circuit, a first neuron value storage circuit and a first processor. The first multiply accumulate circuit includes n memristive cells. The first terminals of the n memristive cells receive a supply voltage. The second terminals of the n memristive cells are connected with a first bit line. The control terminals of the n memristive cells are respectively connected with n word lines. Moreover, n neuron values of a first layer are stored in the first neuron value storage circuit. In an application phase, the first neuron value storage circuit controls the n word lines according to binary codes of the n neuron values. The first processor generates a first neuron value of a second layer.

18 Claims, 7 Drawing Sheets

(51) Int. Cl.
*G06N 3/063* (2006.01)
*H01L 27/24* (2006.01)

(58) Field of Classification Search
CPC . G11C 2213/15; G11C 11/54; G11C 13/0002; G11C 13/0026; G11C 13/003; G11C 13/0061; G11C 13/0069
See application file for complete search history.

(56) References Cited

U.S. PATENT DOCUMENTS

2016/0336064 A1* 11/2016 Seo .................. G06N 3/088
2019/0213468 A1* 7/2019 Chen ................. G11C 11/54

OTHER PUBLICATIONS

Ali Shafiee et al., "ISAAC: A Convolutional Neural Network Accelerator with In-Situ Analog Arithmetic in Crossbars", 2016, pp. 14-26, ACM/IEEE 43rd Annual International Symposium on Computer Architecture.

Arindarn Basu et al., ,"Low-Power, Adaptive Neuromorphic Systems Recent Progress and Future Directions", Mar. 2018, vol. 8, No. 1, pp. 6-27, IEEE Journal On Emerging and Selected Topics in Circuits and Systems.

Office Action issued by Taiwan Intellectual Property Office dated Jun. 22, 2021.

* cited by examiner

CONTROL CIRCUIT FOR MULTIPLY ACCUMULATE CIRCUIT OF NEURAL NETWORK SYSTEM

This application claims the benefit of U.S. provisional application Ser. No. 62/851,582, filed May 22, 2019, the subject matter of which is incorporated herein by reference.

APPLIED TO FIELD OF THE INVENTION

The present invention relates to a circuit for a neural network system, and more particularly to a control circuit for a multiply accumulate circuit of a neural network system.

BACKGROUND OF THE INVENTION

Recently, a neural network system has been widely applied to many AI application systems to provide the intelligent processing capability such as the pattern recognition capability, the data classification capability and the object detection capability. Hereinafter, a neural network system for recognizing numbers will be described.

FIG. 1 is a schematic diagram illustrating the architecture of a neural network system for recognizing numbers. The neural network system 100 is used for recognizing the handwritten numbers on a handwriting board 102. The handwriting board 102 is composed of 784 (=28×28) sensing points.

As shown in FIG. 1, the neural network system 100 comprises an input layer 110, a hidden layer 120 and an output layer 130. Generally, each sensing point on the handwriting board 102 corresponds to an input neuron of the input layer. Consequently, the input layer 110 comprises 784 (=28×28) input neurons $I_0$~$I_{783}$. It means that the size of the input layer 110 is 784.

Since the neural network system 100 has to recognize ten numbers 0~9, the output layer 130 comprises ten output neuron $O_0$~$O_9$. It means that the size of the output layer 130 is 10.

The hidden layer 120 of the neural network system 100 comprises 30 neurons $H_0$~$H_{29}$. That is, the size of the hidden layer 120 is 30. Consequently, the size of the neural network system 100 is indicated as 784-30-10.

Each connection line between the input layer 110 and the hidden layer 120 denotes a neuron connection weight. Similarly, each connection line between the hidden layer 120 and the output layer 130 also denotes a neuron connection weight. Please refer to FIG. 1. The neuron connection weights between the 784 input neurons $I_0$~$I_{783}$ of the input layer 110 and the neuron $H_0$ of the hidden layer 120 are indicated as $IH_{0,0}$~$IH_{783,0}$. Similarly, the neuron connection weights between the 784 input neurons $I_0$~$I_{783}$ of the input layer 110 and the 30 neurons $H_0$~$H_{29}$ of the hidden layer 120 are indicated as $IH_{0,0}$~$IH_{783,0}$ and $(IH_{0,1}$~$IH_{783,1})$~$(IH_{0,29}$~$IH_{783,29})$. Consequently, there are 734×30 neuron connection weights between the input layer 110 and the hidden layer 120.

The 30 neurons $H_0$~$H_{29}$ of the hidden layer 120 are connected with the ten output neurons $O_0$~$O_9$ of the output layer 130. Consequently, 30×10 neuron connection weights between the neurons $H_0$~$H_{29}$ of the hidden layer 120 and the output neuron $O_0$~$O_9$ of the output layer 130 are indicated as $(HO_{0,0}$~$HO_{29,0})$~$(HO_{0,9}$~$HO_{29,9})$. Moreover, the neuron connection weights $(IH_{0,0}$~$IH_{783,0})$~$(IH_{0,29}$~$IH_{783,29})$ and $(HO_{0,0}$~$HO_{29,0})$~$(HO_{0,9}$~$HO_{29,9})$ are collaboratively combined as a weight group.

After the values of the neurons of the previous layer are multiplied by the corresponding neuron connection weights and accumulated, the neuron values of the next layer are acquired. Take the neuron value $H_0$ of the hidden layer 120 for example. The neuron value $H_0$ of the hidden layer 120 is calculated by the following formula:

$$H_0 = I_0 \times IH_{0,0} + I_1 \times IH_{1,0} + \ldots + I_{783} \times IH_{783,0} = \sum_{i=0}^{783} I_i \times IH_{i,0}$$

The other neuron values $H_1$~$H_{29}$ of the hidden layer 120 also can be calculated by referencing the above formula.

Similarly, the output neuron value $O_0$ of the output layer 130 is calculated by the following formula:

$$O_0 = \sum_{j=0}^{29} H_j \times HO_{j,0}$$

The other output neuron values $O_1$~$O_9$ of the output layer 130 also can be calculated by referencing the above formula.

Before the practical applications of the neural network system 100, the neural network system 100 has to be in a training phase to acquire all neuron connection weights in the weight group. After all neuron connection weights in the weight group are acquired through many iterations of training, the well-trained neural network system 100 is established.

In an application phase, the number written on the handwriting board 102 can be recognized by the neural network system 100. As shown in FIG. 1, the number "7" is written on the handwriting board 102. Since the neuron $O_7$ of the output layer 130 has the highest value, the number "7" is recognized by the neural network system 100.

The example of the neural network system 100 as shown in FIG. 1 is presented herein for purpose of illustration and description only. In case that the neural network system is more complicated, the neural network system comprises plural hidden layers to increase the recognition capability. Moreover, the sizes of the hidden layers are not restricted.

Since the multiplication operation and the accumulation operation have to be performed on the neural network system continuously, the use of a computer system can execute the calculations about the multiplication operation and the accumulation operation. For example, all neuron connection weights are stored in the memory of the computer system. Then, a central processing unit (CPU) in the computer system accesses the neuron connection weights from the memory. After the multiplication operation and the accumulation operation are performed according to the neuron connection weights, all neuron values are acquired.

However, as the size of the neural network system is gradually increased, it is necessary to increase the storage capacity of the memory to store the neuron connection weights and the neuron values. Moreover, since the central processing unit has to access the data from the memory, the performance of the computer system is largely reduced and the power consumption of the computer system is increased.

Nowadays, according to the characteristics of the neural network system, a multiply accumulate circuit (also abbreviated as MAC) has been disclosed to calculate the neuron values Please refer to FIGS. 2A, 2B and 2C. FIG. 2A is a schematic diagram illustrating the architecture of a multiply accumulate circuit. FIG. 2B is a schematic circuit diagram illustrating a MAC group with plural multiply accumulate circuits. FIG. 2C is a schematic block diagram illustrating a control circuit.

In FIG. 2A, the multiply accumulate circuit 200 is shown. After the input values $X_1 \sim X_n$ are multiplied by the corresponding weights $W_{1,j} \sim W_{n,j}$ and the products are accumulated, the output value $Y_j$ is acquired according to the following formula:

$$Yj = \sum_{i=1}^{n} X_i \times W_{i,j}$$

When the multiply accumulate circuit 200 is applied to the neural network system, the weights $W_{1,j} \sim W_{n,j}$ of the multiply accumulate circuit 200 are the neuron connection weights. Moreover, the input values are the neuron values of the previous layer, and the output value $Y_j$ is the neuron value of the next layer.

As shown in FIG. 2B, the MAC group 250 comprises plural multiply accumulate circuits 251~25j. The MAC group 250 is used to calculate the size n of the previous layer and the size j of the next layer in the neural network system.

Take the multiply accumulate circuit 251 for example. The multiply accumulate circuit 251 comprises n electrical conductance elements. The n electrical conductance elements have the conductance values $G_{1,1} \sim G_{n,1}$, respectively. Each electrical conductance element comprises a variable resistor. After the resistance value of the variable resistor is tuned, the reciprocal of the resistance value is the conductance value. For example, if the tuned resistance value is 5 ohms (Ω), the conductance value is 0.2 siemens (S). In addition, the conductance values $G_{1,1} \sim G_{n,1}$ are tuned according to the neuron connection weights of the neural network system.

Moreover, the n input terminals of the multiply accumulate circuit 251 receive n input voltages V1~Vn, respectively. The voltage values of the input voltages V1~Vn denote the neuron values of the previous layer. The output terminal of the multiply accumulate circuit 251 generates an output current I1. The output current I1 denotes the neuron value of the next layer. The conductance values $G_{1,1} \sim G_{n,1}$ are connected between the n input terminals and the output terminal of the multiply accumulate circuit 251. The structure of each of the multiply accumulate circuits 252~25j is similar to the structure of the multiply accumulate circuit 251, and is not redundantly described herein.

In a training phase of the neural network system, the n×j conductance values $G_{1,1} \sim G_{n,j}$ of the multiply accumulate circuits 251~25j are tuned and used as n×j neuron connection weights.

In an application phase of the neural network system, the input terminals of the multiply accumulate circuits 251~25j receive the n input voltages V1~Vn, and the output terminals of the multiply accumulate circuits 251~25j are connected with a ground voltage (not shown). Consequently, the output currents I1~Ij from the multiply accumulate circuits 251~25j denote the j neuron values of the next layer.

For example, after the conductance values $G_{1,1} \sim G_{n,1}$ of the multiply accumulate circuit 251 receive the n input voltages V1~Vn, n currents $I_{1,1} \sim I_{n,1}$ are generated. The n currents $I_{1,1} \sim I_{n,1}$ are superposed into an output current I1 according to the following formula:

$$I1 = \sum_{i=1}^{n} I_{i,1} = \sum_{i=1}^{n} Vi \times G_{i,1}$$

As shown in FIG. 2C, the control circuit 290 comprises a digital-to-analog converter (DAC) 260, the MAC group 250 and an analog-to-digital converter (ADC) 270. The digital-to-analog converter 260 is used for converting digital values into analog voltages. The analog-to-digital converter 270 is used for converting analog currents into digital values.

Firstly, the n neuron values Din_1~Din_n of the previous layer are inputted into the digital-to-analog converter 260 and converted into the corresponding n input voltages V1~Vn. Then, the MAC group 250 receives the n input voltages V1~Vn and generates j output currents I1~Ij. Then, the j output currents I1~Ij are received by the analog-to-digital converter 270 and converted into j neuron values Do_1~Do_j of the next layer. The neuron values Din_1~Din_n and the neuron values Do_1~Do_j are digital values.

In other words, the neural network system of any size can be implemented with the control circuit 290 of FIG. 2C. For example, the size of the neural network system 100 as shown in FIG. 1 is indicated as 784-30-10. Consequently, the neural network system 100 comprises two control circuits. The first control circuit receives the 784 neuron values $I_0 \sim I_{783}$ of the input layer 110 and generates the 30 neuron values $H_0 \sim H_{29}$ of the hidden layer 120. The second control circuit receives the 30 neuron values $H_0 \sim H_{29}$ of the hidden layer 120 and generates the output neuron $O_0 \sim O_9$ of the output layer 130.

SUMMARY OF THE INVENTION

The present invention provides a novel structure of a multiply accumulate circuit for a neural network system and an associated control circuit.

An embodiment of the present invention provides a control circuit for a neural network system. The control circuit includes a first multiply accumulate circuit, a first neuron value storage circuit and a first processor. The first multiply accumulate circuit includes n memristive cells. The first terminals of the n memristive cells receive a supply voltage. The second terminals of the n memristive cells are connected with a first bit line. The control terminals of the n memristive cells are respectively connected with n word lines. The first neuron value storage circuit is connected with the n word lines, and includes n registers. Moreover, n neuron values of a first layer are stored in the corresponding registers. The first processor is connected with the first bit line. In an application phase of the neural network system, the first neuron value storage circuit controls the n word lines according to binary codes of the n neuron values, so that the first multiply accumulate circuit generates plural first bitline currents to the first processor through the first bit line. After the first processor performs an analog computation on the plural first bitline currents to covert the plural first bitline currents into an output current, the output current is converted into a first neuron value of a second layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As is well known, a memristor is an electric component with the characteristics of a resistor. Moreover, by providing a specified bias voltage to set the memristor, the memristor has a specified resistance value. After the specified bias voltage is not provided, the resistance value of the memristor is maintained at the specified resistance value and kept unchanged. For changing the resistance value of the memristor again, it is necessary to provide another bias voltage to the memristor. Generally, the memristor can be applied to a resistive random access memory (also abbreviated as RRAM or ReRAM), a non-volatile memory with a floating gate transistor or any other appropriate non-volatile memory.

Figure 1:
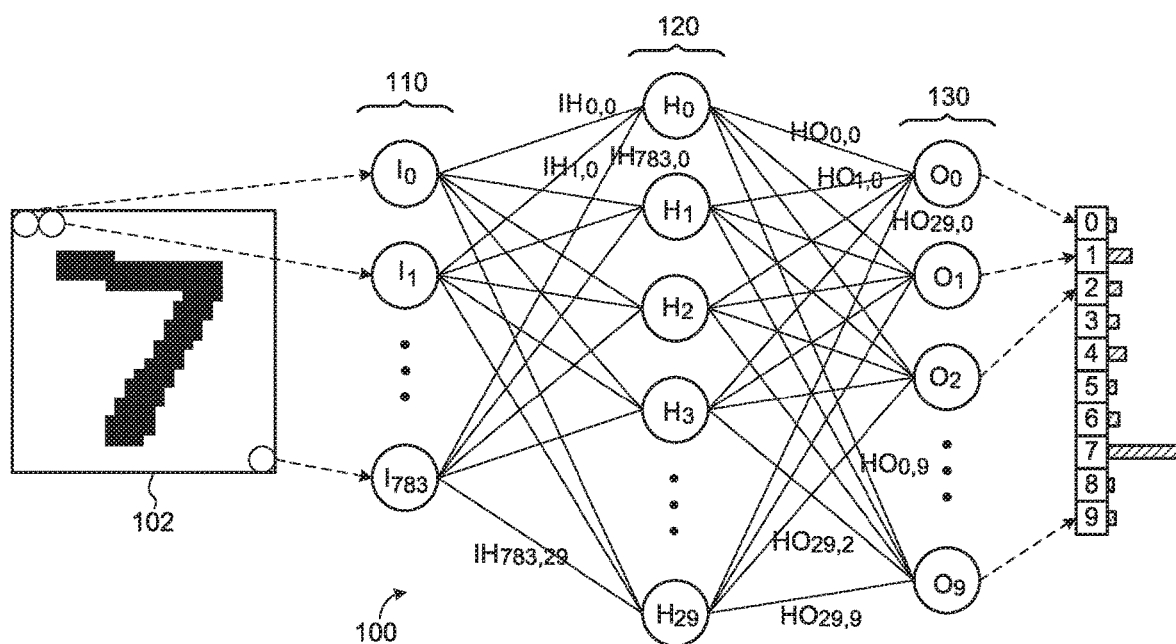
FIG. 1 (prior art) is a schematic diagram illustrating the architecture of a neural network system for recognizing numbers.
Figure 2A:
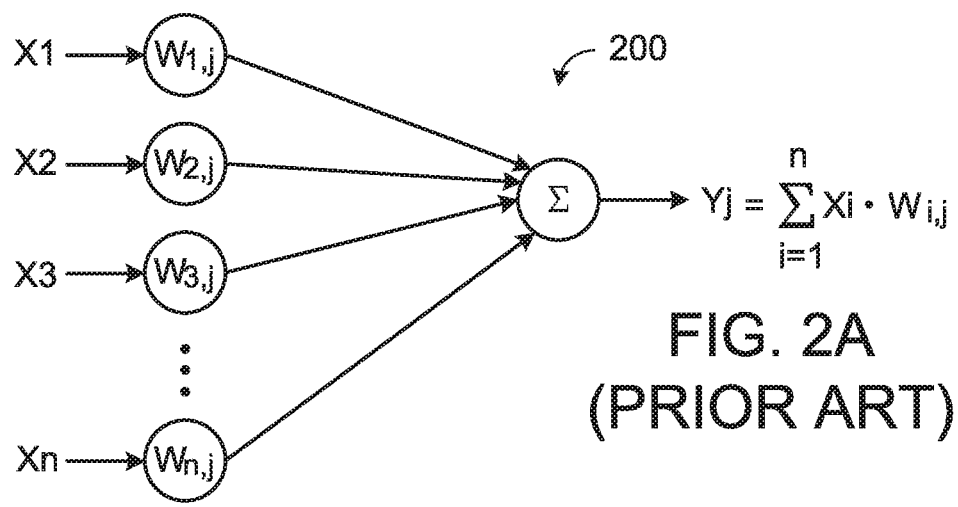
FIG. 2A (prior art) is a schematic diagram illustrating the architecture of a multiply accumulate circuit.
Figure 2B:
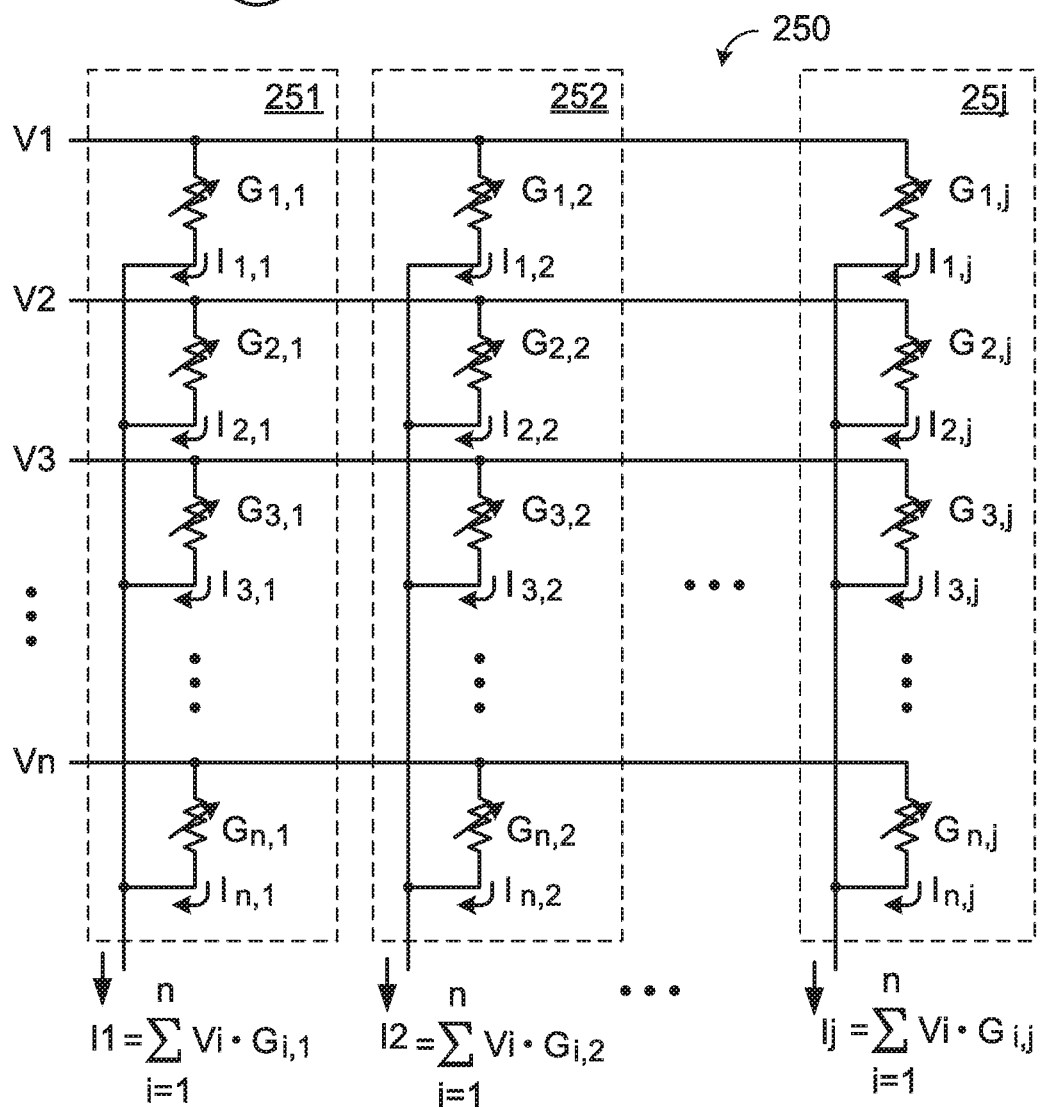
FIG. 2B (prior art) is a schematic circuit diagram illustrating a MAC group with plural multiply accumulate circuits.
Figure 2C:
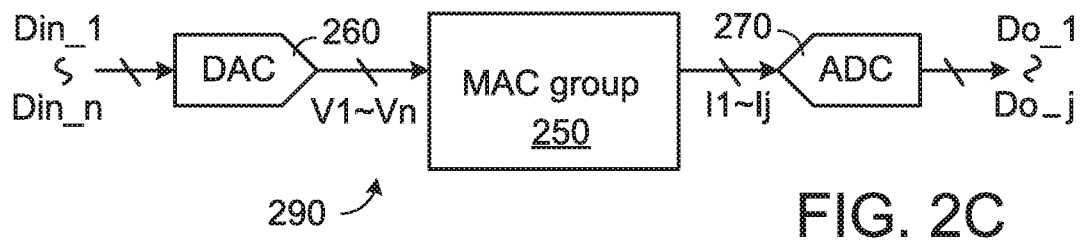
FIG. 2C (prior art) is a schematic block diagram illustrating a control circuit.
Figure 3A:
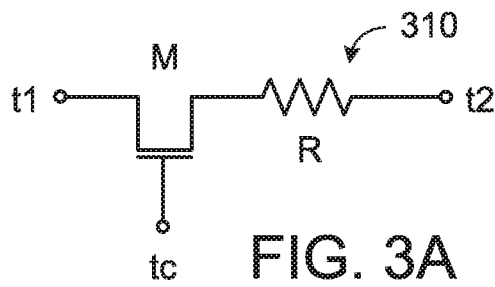
FIG. 3A is a schematic circuit diagram illustrates an example of a memristive cell.

FIG. 3A is a schematic circuit diagram illustrates an example of a memristive cell. As shown in FIG. 3A, the memristive cell 310 comprises a switch transistor M and a memristor R. A first drain/source terminal of the switch transistor M is used as a first terminal t1 of the memristive cell 310. A second drain/source terminal of the switch transistor M is connected with a first terminal of the memristor R. A second terminal of the memristor R is used as a second terminal t2 of the memristive cell 310. A gate terminal of the switch transistor M is used as a control terminal tc of the memristive cell 310. By providing proper bias voltages to the three terminals t1, t2 and tc of the memristive cell 310, the resistance value of the memristor R is correspondingly controlled.

In the memristive cell 310 as shown in FIG. 3A, the switch transistor M is an n-type transistor. In some other embodiments, the switch transistor M is a p-type transistor. Moreover, the memristor R may be implemented with an n-type floating gate transistor or a p-type floating gate transistor.

Figure 3B:
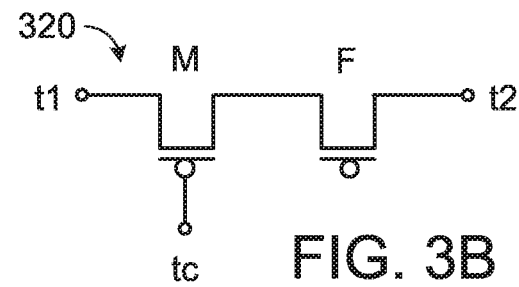
FIG. 3B is a schematic circuit diagram illustrates another example of a memristive cell.

FIG. 3B is a schematic circuit diagram illustrates another example of a memristive cell. As shown in FIG. 3B, the memristive cell 320 comprises a switch transistor M and a floating gate transistor F. A first drain/source terminal of the switch transistor M is used as a first terminal t1 of the memristive cell 320. A second drain/source terminal of the switch transistor M is connected with a first drain/source terminal of the floating gate transistor F. A second drain/source terminal of the floating gate transistor F is used as a second terminal t2 of the memristive cell 320. A gate terminal of the switch transistor M is used as a control terminal tc of the memristive cell 320. By providing proper bias voltages to the three terminals t1, t2 and tc of the memristive cell 320, a specified amount of hot carriers are injected into the floating gate. Consequently, the internal resistance value of the floating gate transistor F is correspondingly controlled. The hot carriers are electrons.

Moreover, plural memristive cells 310, plural memristive cells 320 or other types of memristive cells may be collaboratively formed as a cell array.

Figure 3C:
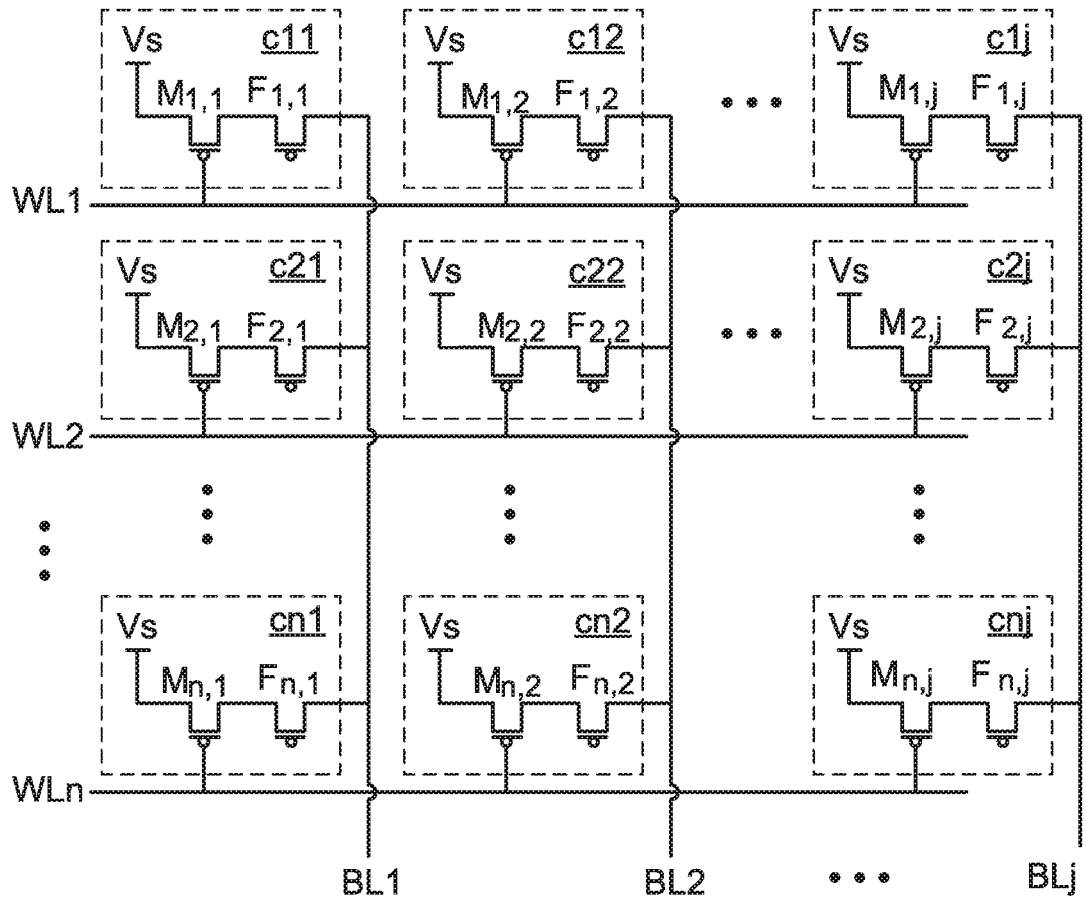
FIG. 3C is a schematic circuit diagram illustrating a cell array with plural memristive cells.

FIG. 3C is a schematic circuit diagram illustrating a cell array with plural memristive cells. As shown in FIG. 3C, the cell array comprises plural memristive cells 320 as shown in FIG. 3B. The cell array 350 comprises n×j memristive cells c11~cnj. The memristive cells c11~cnj comprises respective switch transistors $M_{1,1}$~$M_{n,j}$ and respective floating gate transistors $F_{1,1}$~$F_{n,j}$. The structure of each of the memristive cells c11~cnj is similar to the structure of the memristive cell 320 as shown in FIG. 3B, and is not redundantly described herein. The first terminals of all memristive cells c11~cnj receive a supply voltage Vs.

The control terminals of the first row of j memristive cells c11~c1j in the cell array 350 are connected with a word line WL1. The second terminals of the memristive cells c11~c1j are connected with the corresponding bit lines BL1~BLj, respectively. The control terminals of the second row of j memristive cells c21~c2j in the cell array 350 are connected with a word line WL2. The second terminals of the memristive cells c21~c2j are connected with the corresponding bit lines BL1~BLj, respectively. The rest may be deduced by analog.

The cell array 350 can be applied to a non-volatile memory to store or receive data. During a program action or a read action of the non-volatile memory, one of the n word lines WL1~WLn in the cell array 350 is activated and the other word lines are inactivated. For example, during the program action, the word line WL1 is activated. Meanwhile, various bias voltages are provided to the bit lines BL1~BLj, and different amounts of hot carriers are injected into the floating gates of the floating gate transistors $F_{1,1}$~$F_{1,j}$ of the j memristive cells c11~c1j. Consequently, the internal resistance values of the floating gate transistors $F_{1,1}$~$F_{1,j}$ are correspondingly controlled.

In accordance with a feature of the present invention, a multiply accumulate circuit is implemented with the cell array 350 as shown in FIG. 3C. Moreover, the way of controlling the cell array 350 is specially designed. That is, the cell array and other circuits collaboratively work to form a control circuit in order to define the multiply accumulate circuit of a neural network system.

Figure 4:
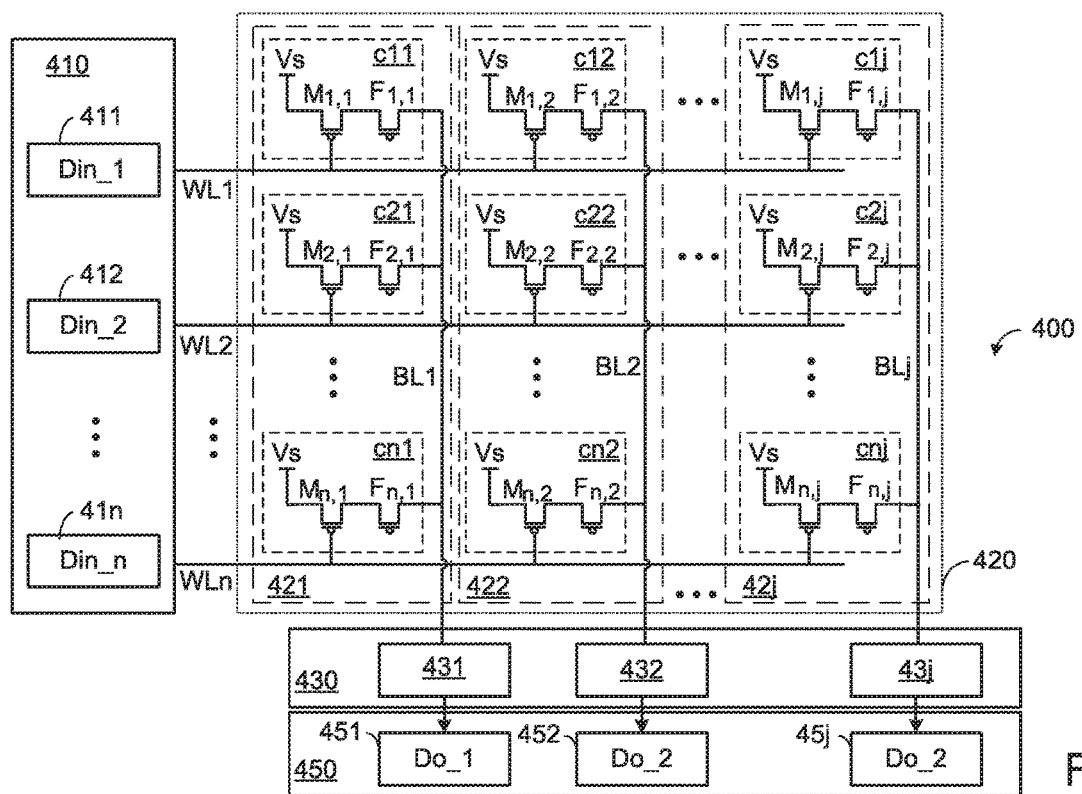
FIG. 4 is a schematic circuit diagram illustrating a control circuit according to an embodiment of the present invention.

FIG. 4 is a schematic circuit diagram illustrating a control circuit according to an embodiment of the present invention. As shown in FIG. 4, the control circuit 400 comprises a first neuron value storage circuit 410, a cell array 420, a processing circuit 430 and a second neuron value storage circuit 450.

The first neuron value storage circuit 410 comprises n registers 411~41n. The n registers 411~41n store n neuron values Din_1~Din_n of the previous layer. The n neuron values Din_1~Din_n are digital values.

The cell array 420 comprises n×j memristive cells c11~cnj. The structure of each of the memristive cells c11~cnj is similar to the structure of the memristive cell 320 as shown in FIG. 3B, and is not redundantly described herein. Alternatively, the structure of each of the memristive cells is similar to the structure of the memristive cell 310. It is noted that the structure of the memristive cell is not restricted. Take the memristive cell c11 for example. The memristive cell c11 comprises a switch transistor $M_{1,1}$ and a floating gate transistor $F_{1,1}$. A first terminal of the memristive cell c11 receives the supply voltage Vs. A second terminal of the memristive cell c11 is connected with the bit line BL1. A control terminal of the memristive cell c11 is connected with the word line WL1.

The n word lines WL1~WLn of the cell array 420 are connected with the first neuron value storage circuit 410. Moreover, each column of n memristive cells in the cell array 420 are defined as a multiply accumulate circuit. That is, the cell array 420 comprises j multiply accumulate circuits 421~42j. The j multiply accumulate circuits 421~42j are connected with the n word lines WL1~WLn. Moreover, the j multiply accumulate circuits 421~42j are connected with the corresponding bit lines BL1~BLj, respectively. For example, the multiply accumulate circuit 421 comprises n memristive cells c11~cn1. The first terminals of the n memristive cells c11~cn1 receive the supply voltage Vs. The second terminals of the n memristive cells c11~cn1 are connected with the bit line BL1. The control terminals of the n memristive cells c11~cn1 are connected with the corresponding word lines WL1~WLn, respectively. The structures of the multiply accumulate circuits 422~42j are similar to the structure of the multiply accumulate circuit 421, and are not redundantly described herein.

The processing circuit 430 comprises j processors 431~43j. The j processors 431~43j are connected with the corresponding bit lines BL1~BLj, respectively. The second neuron value storage circuit 450 is connected with the processing circuit, and the second neuron value storage circuit 450 comprises j registers 451~45j. The j registers 451~45j store the neuron values Do_1~Do_j of the next layer. The j neuron values Do_1~Do_j are digital values.

In this embodiment, the word lines WL1~WLn of the cell array 420 are operated according to the n neuron values Din_1~Din_n. That is, it is not necessary to convert the n neuron values Din_1~Din_n through the digital-to-analog converter (DAC). Especially, the word lines WL1~WLn of the cell array 420 are selectively activated or inactivated according to the binary codes of the neuron values Din_1~Din_n. In other words, two or more than two word lines of the word lines WL1~WLn of the cell array 420 may be activated simultaneously.

Since the neuron values Din_1~Din_n are digital values, the multiply accumulate circuits 421~42j perform multiple operations according to the bit numbers of the neuron values Din_1~Din_n. For example, if the neuron values Din_1~Din_n are 8-bit digital values, the multiply accumulate circuits 421~42j perform eight operations and generate bitline currents to the corresponding bit lines BL1~BLj for eight times.

Moreover, the processors 431~43j of the processing circuit 430 receive the bitline currents from the corresponding bit lines BL1~BLj for many times. After the processors 431~43j perform an analog computation on the bitline currents, the neuron values Do_1~Do_j are generated and transmitted to the j registers 451~45j of the second neuron value storage circuit 450, respectively.

For brevity, the operations of the multiply accumulate circuit 421 and the corresponding processor 431 will be described as follows.

Figure 5A:
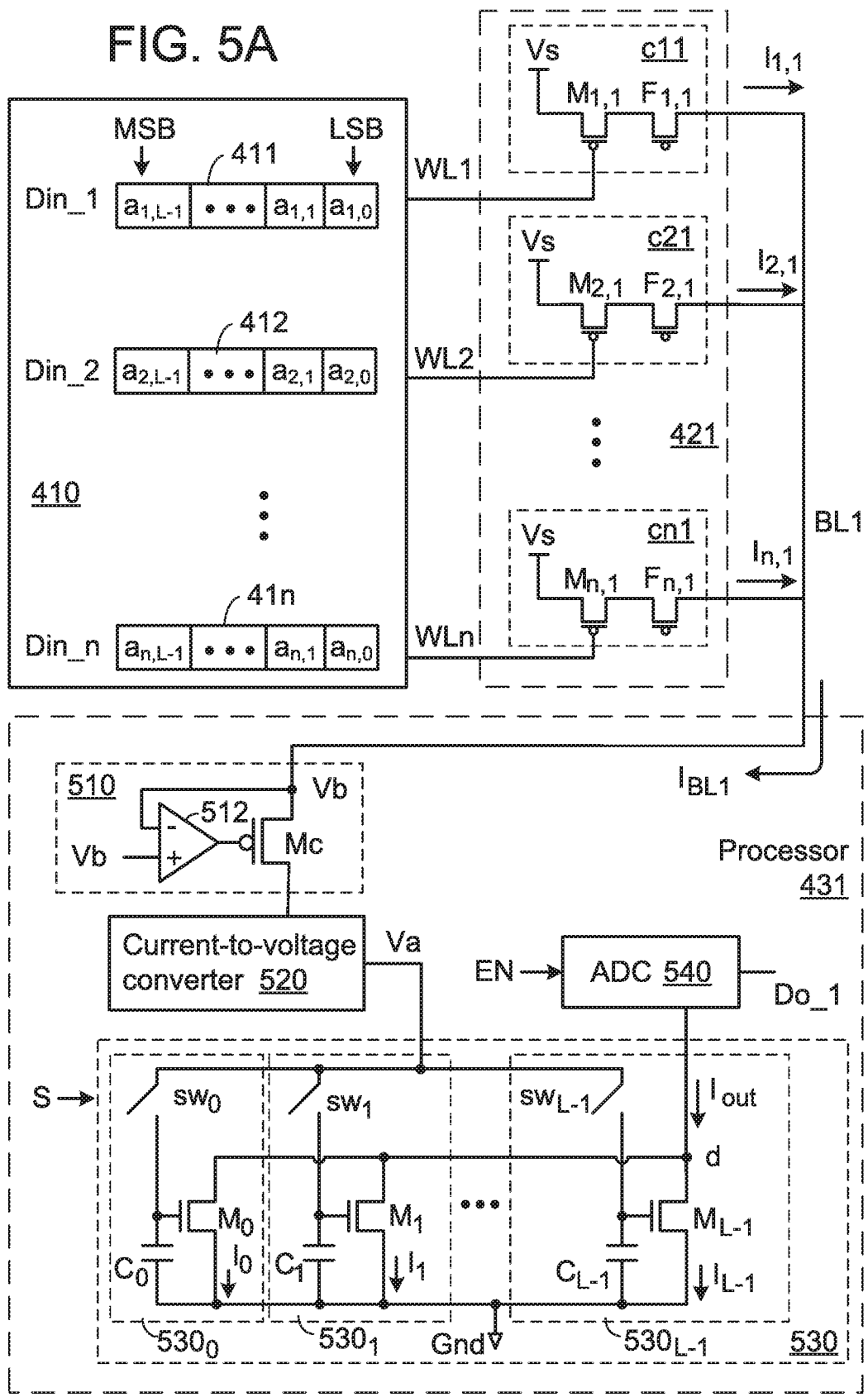
FIG. 5A is a schematic circuit diagram illustrating the operations of a processor of the control circuit according to the embodiment of the present invention.

FIG. 5A is a schematic circuit diagram illustrating the operations of a processor of the control circuit according to the embodiment of the present invention. As shown in FIG. 5A, the processor 431 comprises a voltage clamping circuit 510, a current-to-voltage converter 520, an analog computing circuit 530 and an analog-to-digital converter (ADC) 540. The analog-to-digital converter 540 is used for converting analog currents into digital values.

In the processor 431, the current-to-voltage converter 520 is connected with the voltage clamping circuit 510 for receiving the bitline current $I_{BL1}$ and converting the bitline current $I_{BL1}$ into a converted voltage Va. That is, the input terminal of the current-to-voltage converter 520 receives the bitline current $I_{BL1}$ from the multiply accumulate circuit 421, and the output terminal of the current-to-voltage converter 520 generates the converted voltage Va to the analog computing circuit 530.

The voltage clamping circuit 510 comprises a control transistor Mc and an operation amplifier 512. A first drain/source terminal of the control transistor Mc is connected with the bit line BL1. The second drain/source terminal of the control transistor Mc is connected with an input terminal of the current-to-voltage converter 520. A positive input terminal of the operation amplifier 512 receives a bias voltage Vb. A negative input terminal of the operation amplifier 512 is connected with the first drain/source terminal of the control transistor Mc. An output terminal of the operation amplifier 512 is connected with a gate terminal of the control transistor Mc. Consequently, during the operation of the multiply accumulate circuit 421, the voltage of the bit line BL1 is fixed at the bias voltage Vb.

In some embodiments, the processor 431 is not equipped with the voltage clamping circuit 510. Under this circumstance, the input terminal of the current-to-voltage converter 520 is connected with the bit line BL1. The current-to-voltage converter 520 receives the bitline current $I_{BL1}$ from the multiply accumulate circuit 421, and the output terminal of the current-to-voltage converter 520 generates the converted voltage Va to the analog computing circuit 530.

The analog computing circuit 530 is connected between the current-to-voltage converter 520 and the analog-to-digital converter 540. In this embodiment, the analog computing circuit 530 comprises L amplifying circuits $530_0$~$530_{L-1}$. These amplifying circuits have the identical circuitry structures. For example, the amplifying circuit $530_0$ comprises a switch $sw_0$, a capacitor $C_0$ and an amplifying transistor $M_0$. A first terminal of the switch $sw_0$ is connected with the output terminal of the current-to-voltage converter 520. A second terminal of the switch $sw_0$ is connected with a first terminal of the capacitor $C_0$ and the gate terminal of the amplifying transistor $M_0$. A second terminal of the capacitor $C_0$ is connected with a ground terminal Gnd. A first drain/source terminal of the amplifying transistor $M_0$ is connected with a node d. A second drain/source terminal of the amplifying transistor $M_0$ is connected with the ground terminal Gnd. The node d is also connected with the analog-to-digital converter 540. The analog computing circuit 530 receives a switching signal S. The switches $sw_0 \sim sw_{L-1}$ of the L amplifying circuits $530_0 \sim 530_{L-1}$ are operated according to the switching signal S.

The aspect ratios of the amplifying transistors $M_0 \sim M_{L-1}$ of the amplifying circuits $530_0 \sim 530_{L-1}$ are in a fixed power relationship. For example, the aspect ratio of the amplifying transistor $M_0$ is $2^0 \times (W/L)$. The aspect ratio of the amplifying transistor $M_1$ is $2^1 \times (W/L)$. The rest may be deduced by analogy. The aspect ratio of the amplifying transistor $M_{L-1}$ is $2^{L-1} \times (W/L)$.

In a training phase of the neural network system, the internal resistance values of the n floating gate transistors $F_{1,1} \sim F_{n,1}$ of the multiply accumulate circuit 421 are tuned. For example, the internal resistance values of the floating gate transistors $F_{1,1} \sim F_{n,1}$ are tuned to $r_{1,1} \sim r_{n,1}$, respectively. When the word line WL1 is activated, the switch transistor $M_{1,1}$ of the memristive cell c11 is turned on. Consequently, the cell current $I_{1,1}$ generated by the memristive cell c11 is equal to $[(Vs-Vb)/r_{1,1}]$. Similarly, the other memristive cells c21~cn1 of the multiply accumulate circuit 421 generate the cell currents $I_{2,1} \sim I_{n,1}$, respectively.

In case that the word line WL1 is inactivated, the memristive cell c11 does not generate the cell current $I_{1,1}$. That is, $I_{1,1}=0$. Similarly, in case that the word lines WL2~WLn are inactivated, the corresponding memristive cells c21~cn1 do not generate the cell currents $I_{2,1} \sim I_{n,1}$.

In an application phase of the neural network system, the multiply accumulate circuit 421 performs multiple operations according to the bit numbers of the neuron values Din_1~Din_n. Whenever one operation is performed, a bitline current $I_{BL1}$ is generated to the processor 431. According to the bitline current $I_{BL1}$ generated at each time, the processor 431 generates the neuron values Do_1.

For example, the neuron values Din_1~Din_n are 8-bit values. The first neuron value storage circuit 410 successively provides one bit of the neuron values Din_1~Din_n to control the corresponding word lines WL1~WLn. Consequently, the memristive cells c11~c1j of the multiply accumulate circuit 421 generate the cell currents $I_{1,1} \sim I_{n,1}$. The bitline current $I_{BL1}$ that is equal to the total of the cell currents $I_{1,1} \sim I_{n,1}$ is outputted to the processor 431 through the bit line BL1. Since the neuron values Din_1~Din_n are 8-bit values, the first neuron value storage circuit 410 generates a total of eight bitline currents $I_{BL1}$ to the processor 431. The eight bitline currents $I_{BL1}$ are sequentially converted into eight converted voltages Va by the current-to-voltage converter 520. The converted voltages Va are inputted into the analog computing circuit 530. Then, the analog computing circuit 530 generates an output current $I_{out}$. According to the output current $I_{out}$, the analog-to-digital converter 540 generates the neuron values Do_1 of the next layer.

Similarly, in case that the neuron values Din_1~Din_n are L-bit values, the first neuron value storage circuit 410 generates a total of L bitline currents $I_{BL1}$ to the processor 431 sequentially. The L bitline currents $I_{BL1}$ are sequentially converted into L converted voltages Va by the current-to-voltage converter 520. The converted voltages Va are inputted into the analog computing circuit 530. Then, the analog computing circuit 530 generates an output current $I_{out}$ to the analog-to-digital converter 540. Consequently, the analog-to-digital converter 540 generates the neuron values Do_1 of the next layer.

A method of performing the calculations by the multiply accumulate circuit 421 will be described in more details as follows. Firstly, the first neuron value storage circuit 410 successively provides one bit of the neuron values Din_1~Din_n in the registers 411-41n to control the corresponding word lines WL1~WLn.

Take the register 411 for example. An L-bit neuron value Din_1 is stored in the register 411. The binary codes of the L-bit neuron value Din_1 contain the bits $a_{1,L-1}, \ldots, a_{1,1}, a_{1,0}$ from the most significant bit (MSB) to the least significant bit (LSB) sequentially. If the binary code is "1", the word line WL1 is activated and the switch transistor $M_{1,1}$ is turned on. Consequently, the memristive cell c11 generates the cell current $I_{1,1}$. Whereas, if the binary code is "0", the word line WL1 is inactivated and the switch transistor $M_{1,1}$ is turned off. Consequently, the memristive cell c11 does not generate the cell current $I_{1,1}$. It is noted that control method is not restricted. For example, in another embodiment, the word line WL1 is activated if the binary code is "0", and the word line WL1 is inactivated if the binary code is "1".

Moreover, the on/off states of the switches $sw_0 \sim sw_{L-1}$ of the analog computing circuit 530 are controlled according to the switching signal S and according to the sequence of the binary codes from the register 411. For example, in case that the register 411 provides the binary codes from the most significant bit (MSB) to the least significant bit (LSB) sequentially, the witches $sw_{L-1} \sim sw_0$ are sequentially in the close state according to the switching signal S. For example, when the register 411 provides the most significant bit (MSB), the switch $sw_{L-1}$ is in the close state and the other switches $sw_{L-2} \sim sw_0$ are in the open state according to the switching signal S. The rest may be deduced by analogy. When the register 411 provides the least significant bit (LSB), the switch $sw_0$ is in the close state and the other switches $sw_{L-1} \sim sw_1$ are in the open state according to the switching signal S. Whereas, in case that the register 411 provides the binary codes from the least significant bit (LSB) to the most significant bit (MSB) sequentially, the witches $sw_0 \sim sw_{L-1}$ are sequentially in the close state according to the switching signal S.

During a first operation of the multiply accumulate circuit 421, the first neuron value storage circuit 410 provides the most significant bits (MSB) in the registers 411~41n to control the corresponding word lines WL1~WLn. That is, the first neuron value storage circuit 410 controls the word line WL1 according to the bit "$a_{1,L-1}$" in the register 411, and the first neuron value storage circuits 410 control the word line WL2 according to the bit "$a_{2,L-1}$" in the register 412. The rest may be deduced by analogy. The first neuron value storage circuit 410 controls the word line WLn according to the bit "$a_{n,L-1}$" in the register 41n. Consequently, in the first operation, the bitline current $I_{BL1}$ generated by the multiply accumulate circuit 421 may be expressed by the following formula:

$$I_{BL1} = a_{1,L-1} \cdot I_{1,1} + a_{2,L-1} \cdot I_{2,1} + \ldots + a_{n,L-1} \cdot I_{n,1} = \sum_{i=1}^{n} a_{i,L-1} \cdot I_{i,1}$$

Then, the bitline current $I_{BL1}$ is converted into a first converted voltage Va by the current-to-voltage converter 520. The converted voltage Va is inputted into the analog computing circuit 530. Since the switch $sw_{L-1}$ is in the close state, the converted voltage Va is stored in the capacitor $C_{L-1}$ of the amplifying circuit $530_{L-1}$. The magnitude of the converted voltage Va is in direct proportion to the magnitude of the bitline current $I_{BL1}$.

The rest may be deduced by analogy. During the second last (i.e., the (L−1)-th) operation of the multiply accumulate circuit 421, the first neuron value storage circuit 410 provides the second bits in the registers 411~41n to control the corresponding word lines WL1~WLn. That is, the first neuron value storage circuit 410 controls the word line WL1 according to the bit "$a_{1,1}$" in the register 411, and the first neuron value storage circuits 410 control the word line WL2 according to the bit "$a_{2,1}$" in the register 412. The rest may be deduced by analogy. The first neuron value storage circuit 410 controls the word line WLn according to the bit "$a_{n,1}$" in the register 41n. Consequently, in the (L−1)-th operation, the bitline current $I_{BL1}$ generated by the multiply accumulate circuit 421 may be expressed by the following formula:

$$I_{BL1} = a_{1,1} \cdot I_{1,1} + a_{2,1} \cdot I_{2,1} + \ldots + a_{n,1} \cdot I_{n,1} = \sum_{i=1}^{n} a_{i,L} \cdot I_{i,1}$$

Then, the bitline current $I_{BL1}$ is converted into an (L−1)-th converted voltage Va by the current-to-voltage converter 520. The converted voltage Va is inputted into the analog computing circuit 530. The converted voltage Va is stored in the capacitor $C_1$ of the amplifying circuit $530_1$. Similarly, the magnitude of the converted voltage Va is in direct proportion to the magnitude of the bitline current $I_{BL1}$.

During the last (i.e., the L-th) operation of the multiply accumulate circuit 421, the first neuron value storage circuit 410 provides the least significant bits (LSB) in the registers 411~41n to control the corresponding word lines WL1~WLn. That is, the first neuron value storage circuit 410 controls the word line WL1 according to the bit "$a_{1,0}$" in the register 411, and the first neuron value storage circuits 410 control the word line WL2 according to the bit "$a_{2,0}$" in the register 412. The rest may be deduced by analogy. The first neuron value storage circuit 410 controls the word line WLn according to the bit "$a_{n,0}$" in the register 41n. Consequently, in the L-th operation, the bitline current $I_{BL1}$ generated by the multiply accumulate circuit 421 may be expressed by the following formula:

$$I_{BL1} = a_{1,0} \cdot I_{1,1} + a_{2,0} \cdot I_{2,1} + \ldots + a_{n,0} \cdot I_{n,1} = \sum_{i=1}^{n} a_{i,0} \cdot I_{i,1}$$

Then, the bitline current $I_{BL1}$ is converted into an L-th converted voltage Va by the current-to-voltage converter 520. The converted voltage Va is inputted into the analog computing circuit 530. The converted voltage Va is stored in the capacitor $C_0$ of the amplifying circuit $530_0$. Similarly, the magnitude of the converted voltage Va is in direct proportion to the magnitude of the bitline current $I_{BL1}$.

After the L-th operation of the multiply accumulate circuit 421, the converted voltages Va have been stored in the capacitors $C_0$~$C_{L-1}$ of the amplifying circuits $530_0$~$530_{L-1}$. Then, the analog-to-digital converter 540 is enabled in response to an enabling signal EN. The analog computing circuit 530 generates the output current $I_{out}$ to the analog-to-digital converter 540. According to the output current $I_{out}$, the analog-to-digital converter 540 generates the neuron values Do_1 of the next layer.

As mentioned above, the aspect ratios of the amplifying transistors $M_0$~$M_{L-1}$ of the amplifying circuits $530_0$~$530_{L-1}$ are in a fixed power relationship. The relation between the amplified current $I_0$ generated by the amplifying circuit $530_0$ and the converted voltage Va may be expressed as: $I_0=2^0 \times p_1 \times Va^2$, wherein the amplifying circuits $530_0$~$530_{L-1}$ operate in the saturation region, and $p_1$ is a constant. The relation between the amplified current $I_1$ generated by the amplifying circuit $530_1$ and the converted voltage Va may be expressed as: $I_1=2^1 \times p_1 \times Va^2$. The rest may be deduced by analogy. The relation between the amplified current $I_{L-1}$ generated by the amplifying circuit $530_{L-1}$ and the converted voltage Va may be expressed as: $I_{L-1}=2^{L-1} \times p_1 \times Va^2$. For example, $p_1$ is device parameter of the transistor $M_0$.

Consequently, the output current $I_{out}$ may be calculated by the following formulae:

$$I_{out} = \sum_{b=0}^{L-1} I_b = \sum_{b=0}^{L-1} 2^b \times p_1 \times Va^2 = \sum_{b=0}^{L-1} w^b \times c \times I_{BL1}$$

$$= \sum_{b=0}^{L-1} 2^b \times c \times \left[\sum_{i=1}^{n} a_{i,b} \times I_{i,1}\right]$$

$$= \sum_{i=1}^{n} \left(\sum_{b=0}^{L-1} a_{i,b} \times 2^b\right) \times (c \times I_{i,1}) = \sum_{i=1}^{n} \text{Din}\_i \times (c \times I_{i,1})$$

Since c is a constant, ($c \times I_{i,1}$) may be considered as a neuron connection weight, where i is an integer, and $1 \le i \le n$. In other words, after the n cell currents $I_{1,1}$~$I_{n,1}$ are adjusted, the corresponding n neuron connection weights are adjusted. According to the output current $I_{out}$, the analog-to-digital converter 540 generates the digital neuron values Do_1.

Figure 5B:
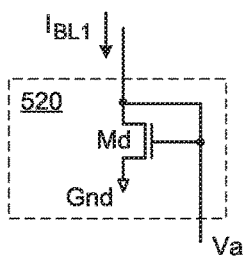
FIG. 5B is a schematic circuit diagram illustrating an example of the current-to-voltage converter of the processor as shown in FIG. 5A.

FIG. 5B is a schematic circuit diagram illustrating an example of the current-to-voltage converter of the processor as shown in FIG. 5A. The current-to-voltage converter 520 comprises a diode-connected transistor Md. A first drain/source terminal of the transistor Md receives the bitline current $I_{BL1}$. A second drain/source terminal of the transistor Md is connected with the ground terminal Gnd. The gate terminal of the transistor Md and the first drain/source terminal of the transistor Md are connected with each other. Consequently, the converted voltage Va=$r_{md} \times I_{BL1}$, wherein $r_{md}$ is the internal resistance value of the diode-connected transistor Md. It is noted that the circuitry structure of the current-to-voltage converter is not restricted to that of the current-to-voltage converter 520 as shown in FIG. 5B. That is, any other appropriate current-to-voltage converter can be used in the processor.

Figure 5C:
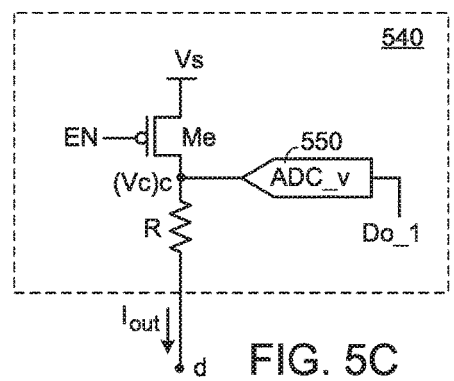
FIG. 5C is a schematic circuit diagram illustrating an example of the analog-to-digital converter of the processor as shown in FIG. 5A.

FIG. 5C is a schematic circuit diagram illustrating an example of the analog-to-digital converter of the processor as shown in FIG. 5A. The analog-to-digital converter 540 is used for converting the analog current into the digital value. As shown in FIG. 5C, the analog-to-digital converter 540 comprises a transistor Me, a resistor R and a voltage-type analog-to-digital conversion circuit ADC_v 550.

A first drain/source terminal of the transistor Me receives the supply voltage Vs. A second drain/source terminal of the transistor Me is connected with a node c. The gate terminal of the transistor Me receives the enabling signal EN. A first terminal of the resistor R is connected with the node c. A second terminal of the resistor R is connected with the node d to receive the output current $I_{out}$. The input terminal of the voltage-type analog-to-digital conversion circuit ADC_v 550 is connected with the node c. The output terminal of the voltage-type analog-to-digital conversion circuit ADC_v 550 generates the digital neuron values Do_1.

When the enabling signal EN is activated (e.g., in the low level state), the transistor Me is turned on and the voltage Vc at the node c is equal to $R \times I_{out}$. Consequently, the voltage Vc at the node c is converted into the digital neuron values Do_1 by the voltage-type analog-to-digital conversion circuit ADC_v 550. It is noted that the circuitry structure of the analog-to-digital converter is not restricted to that of the analog-to-digital converter 540 as shown in FIG. 5C. That is, any other appropriate analog-to-digital converter can be used in the processor.

Figure 5D:
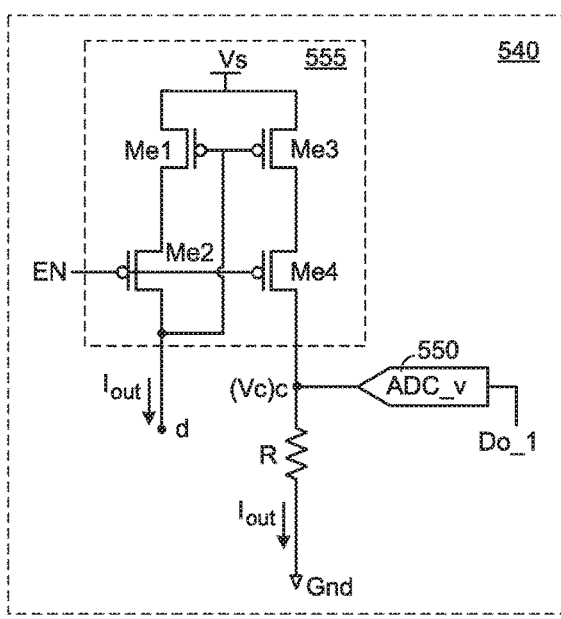
FIG. 5D is a schematic circuit diagram illustrating another example of the analog-to-digital converter of the processor as shown in FIG. 5A.

FIG. 5D is a schematic circuit diagram illustrating another example of the analog-to-digital converter of the processor as shown in FIG. 5A. As shown in FIG. 5D, the analog-to-digital converter 540 comprises a current mirror 555, a resistor R and a voltage-type analog-to-digital conversion circuit ADC_v 550.

The current receiving terminal of the current mirror 555 is connected with the node d to receive the output current $I_{out}$. The control terminal of the current mirror 555 receives the enabling signal EN. The current mirroring terminal of the current mirror 555 is connected with the node c. The current mirroring terminal of the current mirror 555 is capable of generating the output current $I_{out}$ in response to the enabling signal EN. A first terminal of the resistor R is connected with the node c. A second terminal of the resistor R receives a supply voltage Gnd. The input terminal of the voltage-type analog-to-digital conversion circuit ADC_v 550 is connected with the node c. The output terminal of the voltage-type analog-to-digital conversion circuit ADC_v 550 generates the digital neuron values Do_1.

Furthermore, the current mirror 555 includes transistors Me1~Me4. A first drain/source terminal of the transistor Me1 receives the supply voltage Vs. A second drain/source terminal of the transistor Me1 is connected with a first drain/source terminal of the transistor Me2. A gate terminal of the transistor Me1 is connected with the node d. A second drain/source terminal of the transistor Me2 is connected with a node d. A gate terminal of the transistor Me2 receives the enabling signal EN. A first drain/source terminal of the transistor Me3 receives the supply voltage Vs. A second drain/source terminal of the transistor Me3 is connected with a first drain/source terminal of the transistor Me4. A gate terminal of the transistor Me3 is connected with the node d. A second drain/source terminal of the transistor Me4 is connected with a node c. A gate terminal of the transistor Me4 receives the enabling signal EN.

When the enabling signal EN is activated (e.g., in the low level state), the current mirror 555 is enabled and the voltage Vc at the node c is equal to $R \times I_{out}$. Consequently, the voltage Vc at the node c is converted into the digital neuron values Do_1 by the voltage-type analog-to-digital conversion circuit ADC_v 550.

Figure 6:
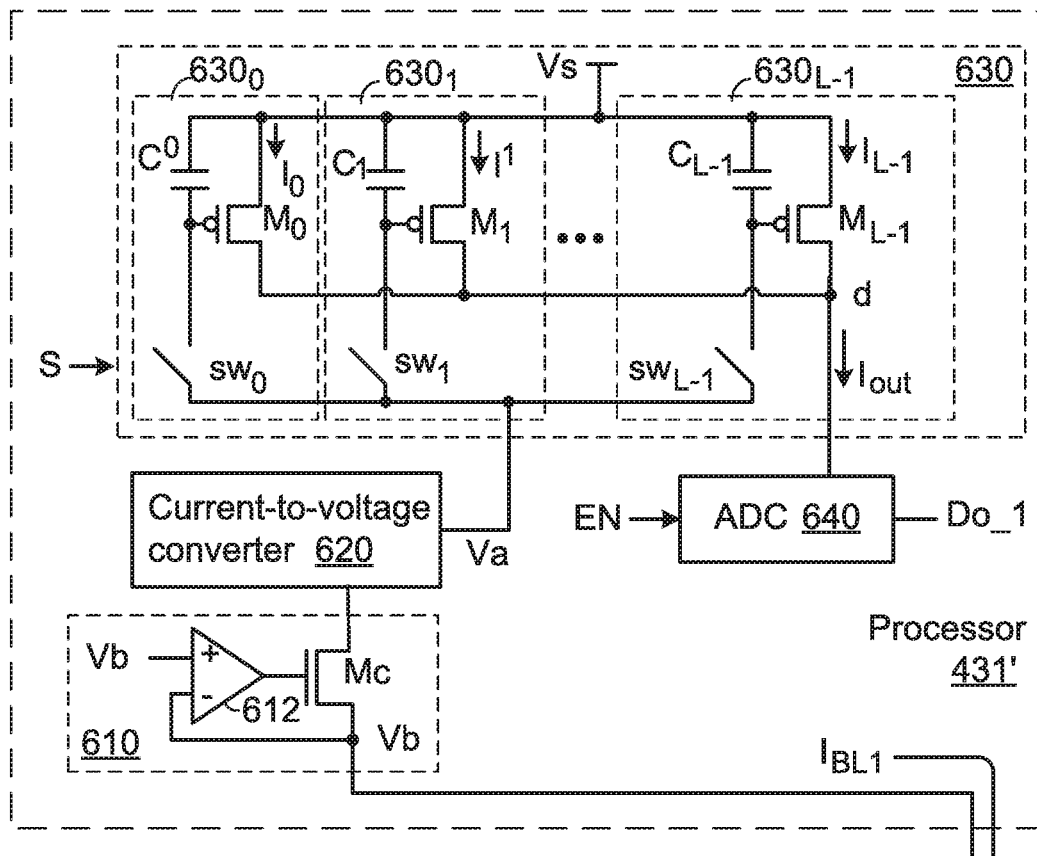
FIG. 6 is a schematic circuit diagram illustrating the operations of a processor of the control circuit according to another embodiment of the present invention.
Figure 6:
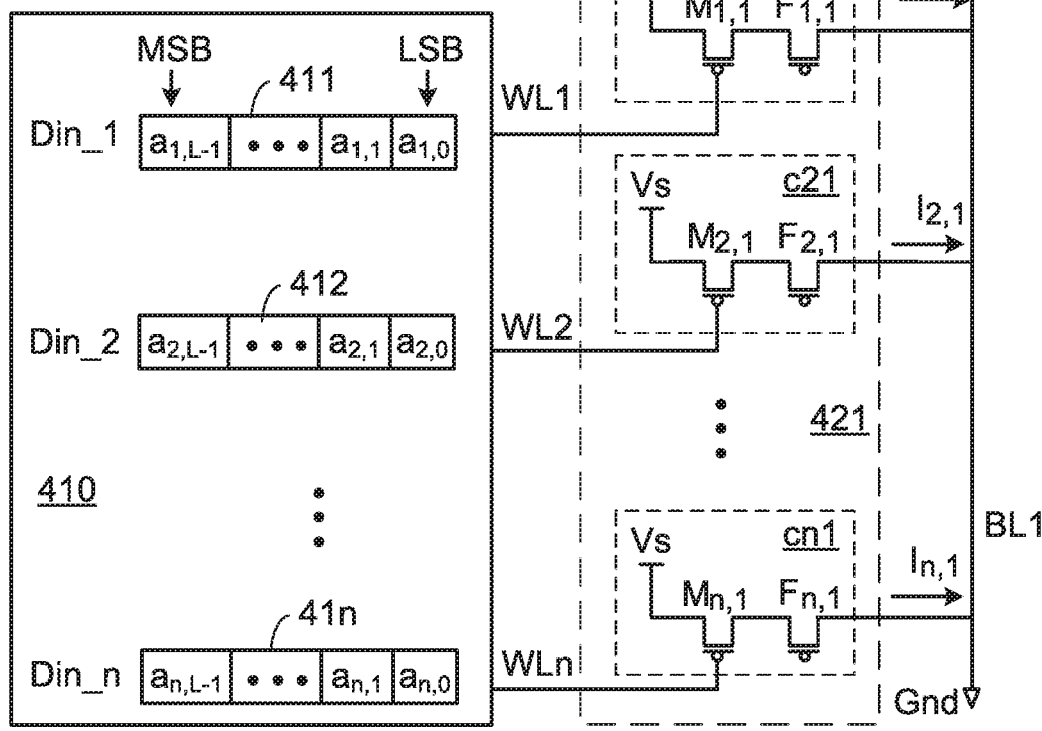

FIG. 6 is a schematic circuit diagram illustrating the operations of a processor of the control circuit according to another embodiment of the present invention. In comparison with the processor 431 of FIG. 5A, the types of the transistors in the processor 431' of this embodiment are distinguished. For example, the p-type transistors are replaced by n-type transistors, and the n-type transistors are replaced by p-type transistors.

As shown in FIG. 6, the processor 431' comprises a voltage clamping circuit 610, a current-to-voltage converter 620, an analog computing circuit 630 and an analog-to-digital converter (ADC) 640. The voltage clamping circuit 610 comprises an operation amplifier 612. The analog computing circuit 630 comprises L amplifying circuits $630_0$~$630_{L-1}$. The analog-to-digital converter 640 is used for converting analog currents into digital values.

The connecting relationships of the components of the processor 431' and the operating principles of the processor 431' are similar to those of the processor 431 as shown in FIG. 5A, and are not redundantly described herein.

From the above descriptions, the present invention provides a multiply accumulate circuit for a neural network system and an associated control circuit. In the control circuit, the binary codes of the neuron values Din_1~Din_n of the previous layer are sequentially provided to control the multiply accumulate circuits 421~42j of the cell array 420. Moreover, the processing circuit 430 receives the bitline currents from the multiply accumulate circuits 421~42j. After an analog computation is performed on the bitline currents, the neuron values Do_1~Do_j of the next layer are generated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control circuit for a neural network system, the control circuit comprising:
   a first multiply accumulate circuit comprising n memristive cells, wherein first terminals of the n memristive cells receive a supply voltage, second terminals of the n memristive cells are connected with a first bit line, and control terminals of the n memristive cells are respectively connected with n word lines;
   a first neuron value storage circuit connected with the n word lines, and comprising n registers, wherein n neuron values of a first layer are stored in the corresponding registers; and
   a first processor connected with the first bit line;
   wherein in an application phase of the neural network system, the first neuron value storage circuit controls the n word lines according to binary codes of the n neuron values, so that the first multiply accumulate circuit generates plural first bitline currents to the first processor through the first bit line, wherein after the first processor performs an analog computation on the plural first bitline currents to covert the plural first bitline currents into an output current, the output current is converted into a first neuron value of a second layer.

2. The control circuit as claimed in claim 1, wherein a first memristive cell of the n memristive cell comprises a switch transistor and a memristor, wherein a gate terminal of the switch transistor is used as the control terminal of the first memristive cell, a first drain/source terminal of the switch transistor is used as the first terminal of the first memristive cell, a second drain/source terminal of the switch transistor is connected with a first terminal of the memristor, and a second terminal of the memristor is used as the second terminal of the first memristive cell.

3. The control circuit as claimed in claim 2, wherein the memristor is a floating gate transistor, wherein a first drain/source terminal of the floating gate transistor is connected with the second drain/source terminal of the switch transistor, and a second drain/source terminal of the floating gate transistor is used as the second terminal of the first memristive cell.

4. The control circuit as claimed in claim 2, wherein in a training phase of the neural network system, a resistance value of the memristor is tuned.

5. The control circuit as claimed in claim 4, wherein a neuron connection weight is adjusted according to the tuned resistance value.

6. The control circuit as claimed in claim 2, further comprises:
a second multiply accumulate circuit comprising n memristive cells, wherein first terminals of the n memristive cells receive the supply voltage, second terminals of the n memristive cells are connected with a second bit line, and control terminals of the n memristive cells are respectively connected with n word lines;
a processing circuit comprising the first processor and a second processor, wherein the second processor is connected with the second bit line, wherein in the application phase of the neural network system, the first neuron value storage circuit controls the n word lines according to the binary codes of the n neuron values, so that the second multiply accumulate circuit generates plural second bitline currents to the second processor, wherein the second processor generates a second neuron value of the second layer according to plural second bitline currents; and
a second neuron value storage circuit comprising a first register and a second register, wherein the first register is connected with the first processor to store the first neuron value of the second layer, and the second register is connected with the second processor to store the second neuron value of the second layer.

7. The control circuit as claimed in claim 1, wherein the binary codes of the n neuron values of the first layer are L-bit values, and the first neuron value storage circuit sequentially provides one bit of the n neuron values for L times to control the n word lines of the first multiply accumulate circuit, so that the first multiply accumulate circuit generates the first bitline currents for L times.

8. The control circuit as claimed in claim 7, wherein the first processor comprises:
a current-to-voltage converter, wherein an input terminal of the current-to-voltage converter receives the first bitline currents from the first bit lines for L times, and an output terminal of the current-to-voltage converter generates L converted voltages;
an analog computing circuit comprising L amplifying circuits for amplifying the L converted voltages into L amplified currents, wherein the L amplified currents are accumulated as an output current, and the output current is outputted from an output terminal of the analog computing circuit; and
an analog-to-digital converter connected with the analog computing circuit, wherein when an enabling signal is activated, the analog-to-digital converter receives the output current and converting the output current into the first neuron value of the second layer.

9. The control circuit as claimed in claim 8, wherein after the converted voltages are multiplied by corresponding powers of 2 and a first constant, the L amplifying circuits generate the L amplified currents.

10. The control circuit as claimed in claim 8, further comprising a voltage clamping circuit, wherein the voltage clamping circuit is connected with the first bit line, and a voltage of first bit line is fixed at a bias voltage by the voltage clamping circuit, wherein the first bitline currents are transmitted to the current-to-voltage converter through the voltage clamping circuit.

11. The control circuit as claimed in claim 10, wherein the voltage clamping circuit comprises:
a control transistor, wherein a first drain/source terminal of the control transistor is connected with the first bit line, and a second drain/source terminal of the control transistor is connected with the input terminal of the current-to-voltage converter, so that the first bitline currents are provided; and
an operation amplifier, wherein a positive input terminal of the operation amplifier receives the bias voltage, a negative input terminal of the operation amplifier is connected with the first drain/source terminal of the control transistor, an output terminal of the operation amplifier is connected with a gate terminal of the control transistor.

12. The control circuit as claimed in claim 8, wherein each amplifying circuit of the analog computing circuit comprises a switch, a capacitor and an amplifying transistor, wherein a first terminal of the switch is connected with the output terminal of the current-to-voltage converter, a second terminal of the switch is connected with a first terminal of the capacitor and a gate terminal of the amplifying transistor, a control terminal of the switch receives a switching signal, a first drain/source terminal of the amplifying transistor is connected with the output terminal of the analog computing circuit, a second drain/source terminal of the amplifying transistor is connected with a second terminal of the capacitor.

13. The control circuit as claimed in claim 12, wherein aspect ratios of the plural amplifying transistors of the plural amplifying circuits are in a specified power relationship.

14. The control circuit as claimed in claim 12, wherein the plural switches of the plural amplifying circuits are controlled according to the switching signal, so that one of the plural switches is in a close state and the other switches are in an open state.

15. The control circuit as claimed in claim 8, wherein the current-to-voltage converter comprises a first transistor, wherein a first drain/source terminal of the first transistor receives the bitline currents, a gate terminal of the first transistor is connected with the first drain/source terminal of the first transistor, and a second drain/source terminal of the first transistor generates the converted voltage.

16. The control circuit as claimed in claim 8, wherein the analog-to-digital converter comprises:
a second transistor, wherein a first drain/source terminal of the second transistor receives a supply voltage, and a gate terminal of the second transistor receives the enabling signal;
a resistor, wherein a first terminal of the resistor is connected with a second drain/source terminal of the second transistor, and a second terminal of the resistor receives the output current; and
a voltage-type analog-to-digital conversion circuit, wherein an input terminal of the voltage-type analog-to-digital conversion circuit is connected with the first terminal of the resistor, and an output terminal of the voltage-type analog-to-digital conversion circuit generates the first neuron value of the second layer.

17. The control circuit as claimed in claim 8, wherein the analog-to-digital converter comprises:
a current mirror, wherein a current receiving terminal of the current mirror receives the output current, and a control terminal of the current mirror receives the enabling signal;
a resistor, wherein a first terminal of the resistor is connected with a current mirroring terminal of the current mirror, and a second terminal of the resistor receives a ground voltage; and a voltage-type analog-to-digital conversion circuit, wherein an input terminal of the voltage-type analog-to-digital conversion circuit is connected with the first terminal of the resistor, and an output terminal of the voltage-type analog-to-digital conversion circuit generates the first neuron value of the second layer.

18. The control circuit as claimed in claim 17, wherein the current mirror includes a second transistor, a third transistor, a fourth transistor and a fifth transistor, a first drain/source terminal of the second transistor receives the supply voltage, a second drain/source terminal of the second transistor is connected with a first drain/source terminal of the third transistor, a gate terminal of the second transistor is connected with a second drain/source terminal of the third transistor, the second drain/source terminal of the third transistor receives the output current, a gate terminal of the third transistor receives the enabling signal, a first drain/source terminal of the fourth transistor receives the supply voltage, a second drain/source terminal of the fourth transistor is connected with a first drain/source terminal of the fifth transistor, a gate terminal of the fourth transistor is connected with the gate terminal of the second transistor, a second drain/source terminal of the fifth transistor is connected with the first terminal of the resistor, and a gate terminal of the fifth transistor receives the enabling signal.

* * * * *